United States Patent
Guiot

(10) Patent No.: US 12,270,123 B2
(45) Date of Patent: *Apr. 8, 2025

(54) METHOD FOR PRODUCING A SUBSTRATE FOR THE EPITAXIAL GROWTH OF A LAYER OF A GALIUM-BASED III-N ALLOY

(71) Applicant: Soitec, Bernin (FR)

(72) Inventor: Eric Guiot, Bernin (FR)

(73) Assignee: Soitec, Bernin (FR)

( * ) Notice: Subject to any disclaimer, the term of this patent is extended or adjusted under 35 U.S.C. 154(b) by 168 days.

This patent is subject to a terminal disclaimer.

(21) Appl. No.: 18/247,859

(22) PCT Filed: Oct. 4, 2021

(86) PCT No.: PCT/FR2021/051708
§ 371 (c)(1),
(2) Date: Apr. 4, 2023

(87) PCT Pub. No.: WO2022/074317
PCT Pub. Date: Apr. 14, 2022

(65) Prior Publication Data
US 2023/0374701 A1    Nov. 23, 2023

(30) Foreign Application Priority Data
Oct. 6, 2020  (FR) ..................................... 2010209

(51) Int. Cl.
*C30B 25/02* (2006.01)
*C30B 25/20* (2006.01)
(Continued)

(52) U.S. Cl.
CPC .......... *C30B 29/406* (2013.01); *C30B 25/205* (2013.01); *H01L 21/76254* (2013.01)

(58) Field of Classification Search
CPC ............... C30B 29/406; C30B 25/205; H01L 21/76254
See application file for complete search history.

(56) References Cited

U.S. PATENT DOCUMENTS 6,474,759 B2 * 11/2002 Hsu ......................... F16B 12/26
                                                                 312/263
8,481,409 B2 *  7/2013 Moriceau .......... H01L 21/76256
                                                                 438/459
(Continued)

FOREIGN PATENT DOCUMENTS

EP    1653504 A1   5/2006
FR    2840731 A1  12/2003

OTHER PUBLICATIONS

French Opinion for Application No. 2010209 dated Jun. 17, 2021, 4 pages.
(Continued)

*Primary Examiner* — Robert M Kunemund
(74) *Attorney, Agent, or Firm* — TraskBritt

(57) ABSTRACT

A method for producing a substrate for the epitaxial growth of a gallium-based III-N alloy layer comprises the following successive steps: —providing a donor substrate of single-crystal silicon carbide; —implanting ions in the donor substrate to form an embrittlement zone defining a thin film layer of single-crystal SiC; —bonding the donor substrate onto a first receiving substrate via a bonding layer; —detaching the donor substrate along the embrittlement zone to transfer the thin film of SiC onto the first receiving substrate; —epitaxially growing a layer of semi-insulating SiC having a thickness greater than 1 µm on the thin film of SiC; —bonding the layer of semi-insulating SiC onto a second receiving substrate having a high electrical resistivity; —removing at least a portion of the bonding layer to detach the first receiving substrate; and —removing the transferred thin film of single-crystal SiC, to expose the semi-insulating SiC layer.

18 Claims, 6 Drawing Sheets

(51) Int. Cl.
*C30B 29/40* (2006.01)
*H01L 21/762* (2006.01)

(56) References Cited

U.S. PATENT DOCUMENTS

2015/0214040 A1    7/2015  Celler
2023/0411140 A1*  12/2023  Guiot .................... C30B 31/22

OTHER PUBLICATIONS

French Search Report for Application No. 2010209 dated Jun. 17, 2021, 2 pages.
Guziewicz et al., Comparative Study on Stress in AlGaN/GaN HEMT Structures Grown on 6H—SiC, Si and Composite Substrates of the 6H—SiC/poly-SiC and Si/poly-SiC, Journal of Physics: Conference Series 100 (2008) 042035, 5 pages.
International Search Report for International Application No. PCT/FR2021/051708 dated Feb. 4, 2022, 2 pages.
International Written Opinion for International Application No. PCT/FR2021/051708 dated Feb. 4, 2022, 5 pages.

\* cited by examiner

METHOD FOR PRODUCING A SUBSTRATE FOR THE EPITAXIAL GROWTH OF A LAYER OF A GALIUM-BASED III-N ALLOY

CROSS-REFERENCE TO RELATED APPLICATIONS

This application is a national phase entry under 35 U.S.C. § 371 of International Patent Application PCT/FR2021/051708, filed Oct. 4, 2021, designating the United States of America and published as International Patent Publication WO 2022/074317 A1 on Apr. 14, 2022, which claims the benefit under Article 8 of the Patent Cooperation Treaty to French Patent Application Serial No. FR2010209, filed Oct. 6, 2020.

TECHNICAL FIELD

The present disclosure relates to a process for fabricating a substrate for the epitaxial growth of a layer of a III-N alloy based on gallium (i.e., a layer of gallium nitride (GaN), of aluminum gallium nitride (AlGaN) or a layer of indium gallium nitride (InGaN)), to a process for fabricating such a layer of III-N alloy and to a process for fabricating a high-electron-mobility transistor (HEMT) in such a layer of III-N alloy.

BACKGROUND

III-N semiconductors, in particular, gallium nitride (GaN), aluminum gallium nitride (AlGaN) or indium gallium nitride (InGaN), appear to be particularly promising, in particular, with regard to the formation of high-power light-emitting diodes (LEDs) and of electronic devices operating at high frequency, such as high-electron-mobility transistors (HEMTs) or other field-effect transistors (FETs).

Insofar as these III-N alloys are difficult to find in the form of bulk substrates of large size, they are generally formed by heteroepitaxy, i.e., by epitaxy on a substrate made of a different material.

Selection of such a substrate, in particular, takes into account the difference in lattice parameter and the difference in coefficient of thermal expansion between the material of the substrate and the III-N alloy. Specifically, the larger these differences, the greater the risk of formation, in the layer of III-N alloy, of crystal defects, such as dislocations, and the greater the risk of generation of high mechanical stresses, liable to cause excessive strains.

The materials most frequently considered for the heteroepitaxy of III-N alloys are sapphire and silicon carbide (SiC).

Apart from its smaller difference in lattice parameter with gallium nitride, silicon carbide is particularly preferred for high-power electronic applications because of its thermal conductivity, which is clearly higher than that of sapphire, and which, therefore, allows the thermal energy generated during component operation to be more easily dissipated.

In radiofrequency (RF) applications, it is sought to use semi-insulating silicon carbide, i.e., silicon carbide that typically has an electrical resistivity higher than or equal to 105 Sam, in order to minimize parasitic losses (generally called RF losses) in the substrate. However, this material is particularly expensive and currently is available only in the form of substrates of limited size.

Silicon would allow fabricating costs to be drastically decreased and substrates of large size to be accessed, but structures of III-N-alloy-on-silicon type are penalized by RF propagation losses above 20 GHz and by a poor dissipation of heat.

Composite structures, such as SopSiC or SiCopSiC structures, have also been investigated [1] but have not proved to be entirely satisfactory. These structures comprise a layer of single-crystal silicon or a layer of single-crystal SiC (intended to form a seed layer for the epitaxial growth of the gallium nitride) on a polycrystalline SiC substrate, respectively. Although polycrystalline SiC is a material that is inexpensive, that is available in the form of substrates of large size and that dissipates heat well, these composite structures are penalized by the presence of a layer of silicon oxide at the interface between the layer of single-crystal silicon or SiC and the polycrystalline SiC substrate, which forms a thermal barrier hindering the dissipation of heat from the layer of III-N alloy to the polycrystalline SiC substrate.

BRIEF SUMMARY

One object of the present disclosure is therefore to remedy the aforementioned drawbacks and, in particular, limitations related to the size and cost of semi-insulating SiC substrates.

The object of the present disclosure is, therefore, to provide a process for fabricating a substrate for the epitaxial growth of a III-N alloy based on gallium, in particular, with a view to forming HEMTs or other high-frequency, high-power electronic devices in which RF losses are minimized and the dissipation of heat is maximized.

To this end, the present disclosure provides a process for fabricating a substrate for epitaxial growth of a layer of gallium nitride (GaN), of aluminum gallium nitride (AlGaN) or of indium gallium nitride (InGaN), comprising the following successive steps:

providing a single-crystal silicon-carbide donor substrate, implanting ionic species into the donor substrate so as to form a weakened region that defines a thin layer of single-crystal SiC to be transferred, bonding the donor substrate to a first receiver substrate via a bonding layer, detaching the donor substrate along the weakened region so as to transfer the thin layer of SiC to the first receiver substrate, performing epitaxial growth of a layer (30) of semi-insulating SiC having a thickness greater than 1 µm on the thin layer of SiC, bonding the layer of semi-insulating SiC to a second receiver substrate, the second receiver substrate having a high electrical resistivity, removing at least one portion of the bonding layer so as to detach the first receiver substrate, removing the transferred thin layer of single-crystal SiC, so as to uncover the layer of semi-insulating SiC.

By "high frequency," what is meant in the present text is a frequency higher than 3 kHz.

By "high power," what is meant in the present text is a power higher than 0.5 W/mm injected through the gate of the transistor.

By "high electrical resistivity," what is meant in the present text is an electrical resistivity higher than or equal to 100 Ω·cm.

By "semi-insulating SiC," what is meant in the present text is silicon carbide having an electrical resistivity higher than or equal to 105 Ω·cm.

This process allows a substrate, based on silicon or another low-cost material of high electrical resistivity available in large size, comprising a layer of semi-insulating SiC having a crystal quality suitable for the subsequent epitaxial growth of a layer of III-N alloy to be formed and the final structure to benefit from the good properties thereof as regards the dissipation of heat and the limitation of RF losses. Since the layer of semi-insulating SiC makes direct contact with the silicon substrate (or substrate of another material of high electrical resistivity), the structure further contains no thermal barrier.

A process that consisted in forming the layer of semi-insulating SiC by epitaxy directly on a silicon substrate of high electrical resistivity would lead to the formation of a high number of dislocations in the semi-insulating SiC because of the difference in lattice parameter between silicon and silicon carbide. In contrast, the process according to the disclosure makes it possible to use, as seed for the growth of the semi-insulating SiC, a layer of single-crystal SiC the quality of which is optimal because it was obtained via transfer from the donor substrate.

Moreover, the use of the first receiver substrate, which plays the role of temporary carrier, allows the silicon face of the SiC to be oriented optimally in the various steps of the process.

According to advantageous but optional features of the process, which may be implemented separately or in any technically possible combination thereof:
- the first receiver substrate and the donor substrate have a difference in coefficient of thermal expansion less than or equal to $3 \times 10^{-6}$ $K^{-1}$;
- the first receiver substrate is an SiC substrate having a crystal quality lower than that of the donor substrate;
- the thin layer of single-crystal SiC transferred to the first receiver substrate has a thickness less than 1 μm;
- the bonding layer is formed from a material that remains thermally stable during the epitaxial growth of the layer of semi-insulating SiC and that is able to be removed from the interface between the transferred layer of single-crystal SiC and the first receiver substrate;
- the bonding layer is a layer of silicon nitride or of gallium nitride;
- removing at least one portion of the bonding layer comprises a chemical etch, a delamination by laser and/or the application of a mechanical stress;
- the layer of semi-insulating SiC is formed by doping with vanadium during the epitaxial growth of the SiC;
- the layer of semi-insulating SiC is formed by simultaneously depositing silicon, carbon and vanadium;
- the second receiver substrate is a silicon substrate having an electrical resistivity higher than or equal to 100 Ω·cm;
- the epitaxial layer of semi-insulating SiC has a thickness between 1 and 5 μm;
- the second receiver substrate is a polycrystalline SiC substrate or a polycrystalline AlN substrate having an electrical resistivity higher than or equal to 100 Ω·cm;
- the epitaxial layer of semi-insulating SiC has a thickness less than or equal to 80 μm;
- the process further comprises a step of recycling the segment of the donor substrate detached from the transferred layer, with a view to forming a new donor substrate;
- the ionic species are implanted through the silicon face of the donor substrate, and the silicon face of the donor substrate is bonded to the first receiver substrate, so that, after the transferred thin layer of single-crystal SiC has been removed, the silicon face of the layer of semi-insulating SiC is uncovered.

Another subject of the present disclosure relates to a process for fabricating a layer of a III-N alloy based on gallium on a substrate obtained using the process that has just been described.

The process comprises:
  providing a substrate fabricated using the process such as described above, and
  performing epitaxial growth of the layer of gallium nitride on the layer of semi-insulating SiC of the substrate.

In certain embodiments, the layer of gallium nitride has a thickness between 1 and 2 μm.

Another embodiment of the disclosure relates to a process for fabricating a high-electron-mobility transistor (HEMT) in such a layer of III-N alloy.

The process comprises:
  fabricating by epitaxy a layer of gallium nitride, of aluminum gallium nitride or of indium gallium nitride using the process such as described above,
  forming a heterojunction by epitaxy, on the layer, of a layer of a III-N material different from the material of the layer,
  forming a channel of the transistor level with the heterojunction, and
  forming a source, a drain and a gate of the transistor on the channel.

BRIEF DESCRIPTION OF THE DRAWINGS

Further features and advantages of embodiments of the disclosure will become apparent from the following detailed description, with reference to the appended drawings, in which.

For the sake of legibility of the figures, the various layers have not necessarily been shown to scale.

DETAILED DESCRIPTION

The present disclosure provides a process for fabricating substrates for the epitaxial growth of binary or ternary III-N alloys based on gallium. The alloys comprise gallium nitride (GaN), aluminum gallium nitride ($Al_xGa_{1-x}N$, where $0<x<1$, designated in abbreviated form by AlGaN below) and indium gallium nitride ($In_xGa_{1-x}N$, where $0<x<1$, designated in abbreviated form by InGaN below). For the sake of conciseness, in the rest of the text the fabrication of a substrate for the epitaxial growth of a layer of GaN will be described; however, a person skilled in the art will be able to tailor the growth conditions to form a layer of AlGaN or of InGaN, the substrate serving for this epitaxial growth remaining the same.

The process uses a donor substrate of doped semiconductor single-crystal silicon carbide (SiC), a thin layer of which, transferred to a first receiver substrate, will serve as seed for the growth of a layer of semi-insulating SiC. In the rest of the text, a transfer of the layer via the SMART CUT® process will be considered; however, it goes without saying that any other layer-transfer technique may be used, for example, spalling or laser cutting.

To this end, a single-crystal SiC substrate having an excellent crystal quality, i.e., in particular, a substrate free of dislocations, will be chosen.

In certain embodiments, the donor substrate may be a bulk substrate of single-crystal SiC. In other embodiments, the donor substrate may be a composite substrate, comprising a superficial layer of single-crystal SiC and at least one other layer of another material. In this case, the layer of single-crystal SiC will have a thickness greater than or equal to 0.5 µm.

There are various crystal forms (also called polytypes) of silicon carbide. The most common are the forms 4H, 6H and 3C. Preferably, the single-crystal silicon carbide is chosen from the 4H and 6H polytypes, but any polytype may be used to implement the present disclosure.

In the figures, a bulk donor substrate 10 of single-crystal SiC has been shown.

Figure 1:
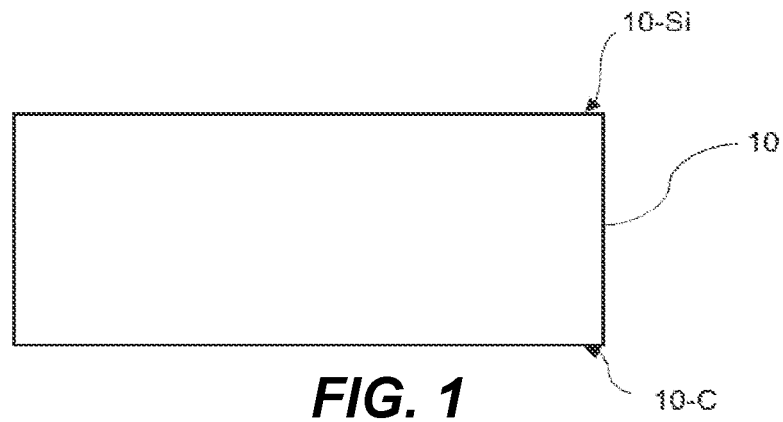
FIG. 1 is a schematic cross-sectional view of a single-crystal SiC donor substrate.

As known per se, as illustrated in FIG. 1, such a substrate has a silicon face 10-Si and a carbon face 10-C.

At the present time, processes of epitaxy of GaN are mainly implemented on the silicon face of the SiC. However, it is not impossible to grow GaN on the carbon face of the SiC. The orientation of the donor substrate (silicon face/carbon face) during the implementation of the method is chosen depending on the face of the SiC intended for the growth of the layer of GaN.

Figure 2:
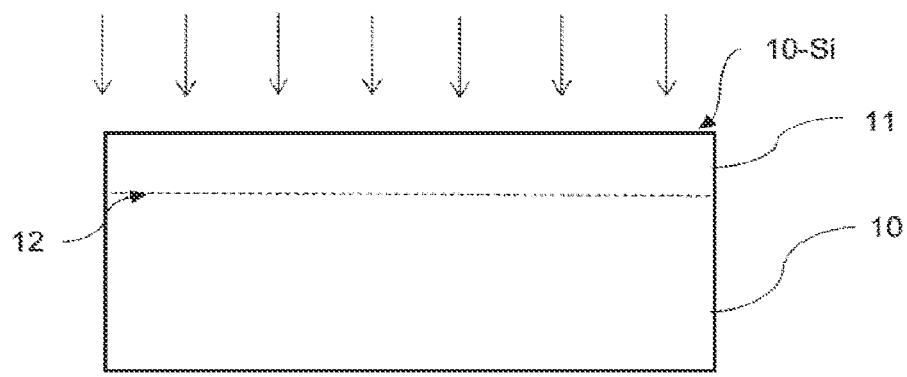
FIG. 2 is a schematic cross-sectional view of the donor substrate of FIG. 1, in which substrate a weakened region has been formed by implanting ionic species in order to define a thin layer to be transferred.

With reference to FIG. 2, ionic species are implanted into the bulk donor substrate 10, so as to form a weakened region 12 that defines a thin layer 11 of single-crystal SiC. The implanted species typically comprise hydrogen and/or helium. A person skilled in the art will be able to define the required implantation dose and energy.

When the donor substrate is a composite substrate, the implantation is carried out into the surface layer of single-crystal SiC of the substrate.

Preferably, the ionic species are implanted through the silicon face 10-Si of the donor substrate. As will be seen below, this orientation of the donor substrate makes it possible to put, at the surface of the final substrate intended for the growth of the layer of GaN, the silicon face of the SiC, which is more favorable. However, if it is envisioned to grow the layer of GaN on the carbon face of the SiC, the ionic species must be implanted through the carbon face 10-C of the donor substrate.

Preferably, the thin layer 11 of single-crystal SiC has a thickness less than 1 µm. Specifically, such a thickness is accessible on an industrial scale with the SMART CUT® process. In particular, the implantation tools available on industrial fabrication lines allow such an implantation depth to be obtained.

Figure 3:
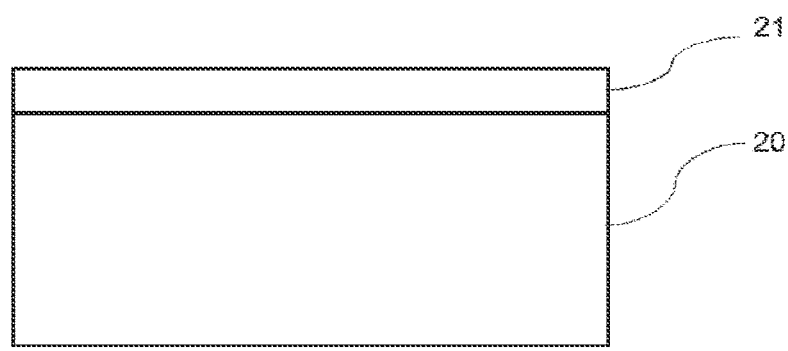
FIG. 3 is a schematic cross-sectional view of a temporary carrier covered with a removable bonding layer.

With reference to FIG. 3, a first receiver substrate 20 is moreover provided.

The main function of the first receiver substrate 20 is to temporarily hold the thin layer 11 of single-crystal SiC between its transfer from the donor substrate and the growth of a layer of semi-insulating SiC on the layer of single-crystal SiC.

To this end, the first receiver substrate is chosen to have a coefficient of thermal expansion substantially equal to that of the SiC, in order not to generate stresses or strains during the epitaxy of the semi-insulating SiC. Thus, particularly advantageously, the first receiver substrate and the donor substrate (or the layer of single-crystal SiC in the case of a composite donor substrate) have a difference in coefficient of thermal expansion less than or equal to $3\times10^{-6}$ $K^{-1}$.

Preferably, the first receiver substrate is also made of SiC so as to minimize the difference in coefficient of thermal expansion. Particularly advantageously, the first receiver substrate 20 is an SiC substrate having a crystal quality lower than that of the donor substrate. What is meant by that is that the first receiver substrate may be a polycrystalline SiC substrate, or indeed, a substrate of single-crystal SiC, but that may comprise dislocations of all types (contrary to the single-crystal SiC of the donor substrate, which is chosen for an excellent crystal quality in order to ensure the quality of the epitaxial layer of GaN). Such a substrate of lower crystal quality has the advantage of being less expensive than a substrate of same quality as the donor substrate, while being perfectly adapted to the function of temporary carrier.

Figure 4:
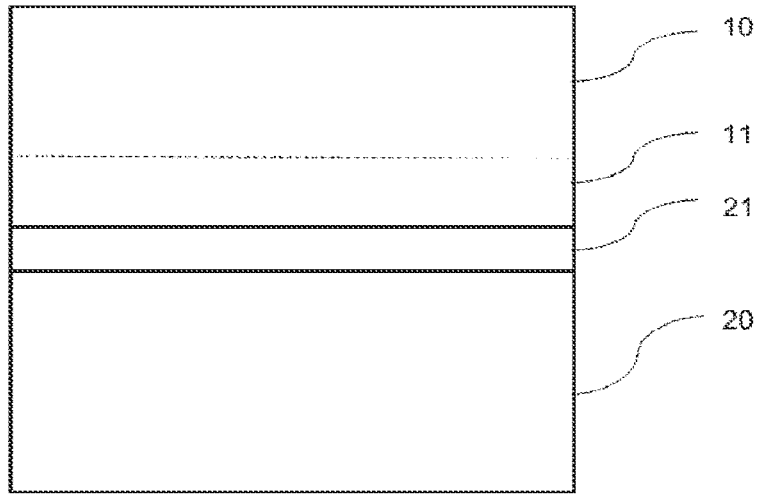
FIG. 4 is a schematic cross-sectional view of the temporary carrier of FIG. 3 being joined to the donor substrate of FIG. 2 via the removable bonding layer.

With reference to FIG. 4, the bulk donor substrate 10 comprising the thin layer 11 of single-crystal SiC is bonded to the first receiver substrate 20.

To ensure a good adhesion of the donor substrate to the first donor substrate, a bonding layer 21 is formed at the interface between the substrates.

In FIG. 3, the bonding layer 21 is formed on the first receiver substrate 20, but, in other embodiments that are not illustrated, the bonding layer may be formed on the donor substrate (on the side of the thin layer 11), or indeed partially on the donor substrate and partially on the first receiver substrate.

The bonding layer is formed from a material that remains thermally stable during the subsequent epitaxial growth of the semi-insulating SiC on the thin layer 11.

By way of indication, since epitaxy of 4H- or 6H—SiC is carried out at a temperature typically higher than 1500° C., the material of the chosen bonding layer will not degrade or disassociate at such a temperature.

Moreover, the material of the bonding layer is able to be removed from the interface between the transferred layer of single-crystal SiC and the first receiver substrate 20, for example, by way of a selective etch, which is optionally assisted by a plasma.

According to one preferred embodiment, the bonding layer is a layer of silicon nitride or of gallium nitride. The thickness of the layer is typically between 10 nm and a few hundred nanometers.

Figure 5:
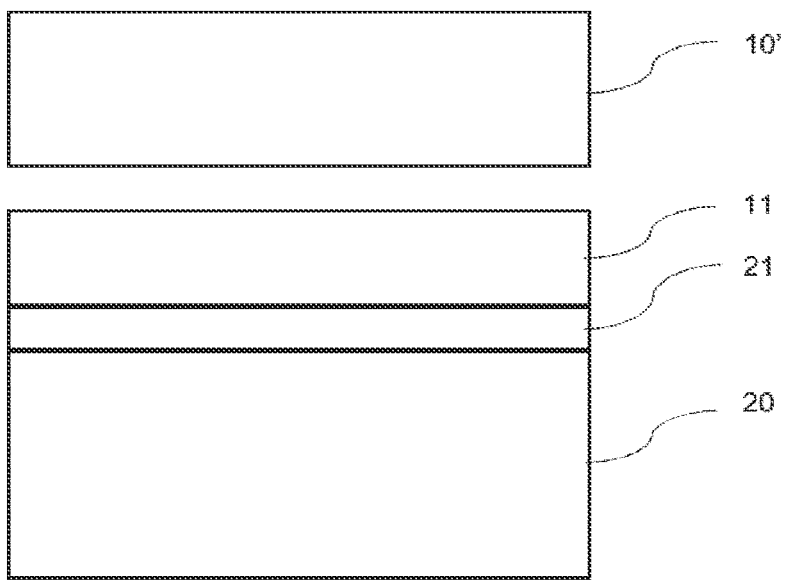
FIG. 5 is a schematic cross-sectional view of the donor substrate being detached along the weakened region in order to transfer the thin layer of single-crystal SiC to the temporary carrier.

With reference to FIG. 5, the donor substrate is detached along the weakened region 12. In a way known per se, the detachment may be caused by a heat treatment, a mechanical action, or a combination of these means.

The effect of this detachment is to transfer the thin layer 11 of single-crystal SiC to the first receiver substrate 20. The remainder 10' of the donor substrate may optionally be recycled with a view to another use.

Figure 6:
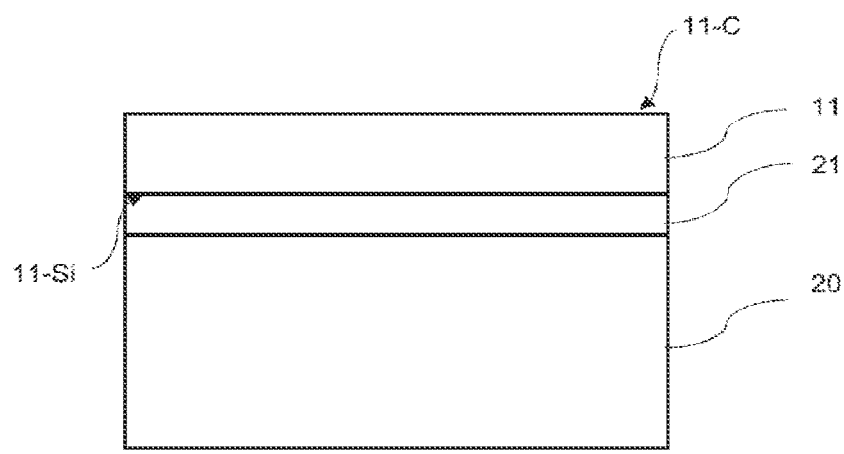
FIG. 6 is a schematic cross-sectional view of the thin layer of single-crystal SiC transferred to the temporary carrier after its free surface has been polished.

As illustrated in FIG. 6, the free face of the transferred thin layer 11 of single-crystal SiC is the carbon face 11-C (the silicon face 11-Si being on the side of the bonding interface). This face is polished, for example, by chemical-mechanical polishing (CMP), to remove defects related to the implantation of ionic species and to decrease the roughness of the thin layer 11.

Figure 7:
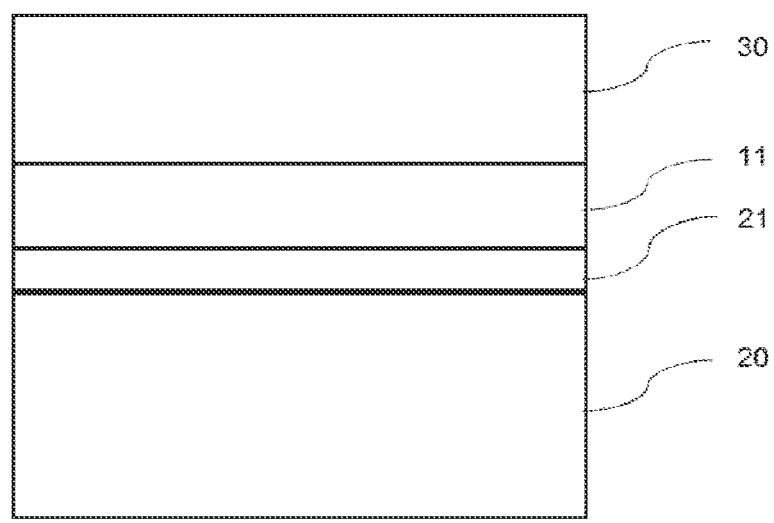
FIG. 7 is a schematic cross-sectional view of a layer of semi-insulating SiC being formed by epitaxy on the transferred thin layer of single-crystal SiC.

With reference to FIG. 7, an epitaxial growth of a layer 30 of semi-insulating SiC is performed on the thin layer 11 of single-crystal SiC. The polytype of the semi-insulating SiC is advantageously identical to that of the SiC of the donor substrate.

This epitaxial growth is performed at a very high temperature, generally higher than 1500° C. but, as explained above, the bonding layer 21 is stable at this temperature. In addition, on account of the small difference in coefficient of thermal expansion between the material of the first receiver substrate and the SiC, the mechanical stresses generated in the stack are minimized.

There are various techniques for forming semi-insulating SiC. According to one embodiment, the layer of SiC is doped with vanadium during its epitaxial growth. According to another embodiment, silicon, carbon and vanadium are simultaneously deposited using suitable precursors in an epitaxial reactor.

The layer of semi-insulating SiC advantageously has a thickness greater than 1 µm, so as to contribute in a significant way to the dissipation of heat within the final structure. This thickness is greater than the thickness directly accessible with the SMART CUT® process using industrially available equipment.

Thus, the process consisting in transferring a layer of single-crystal SiC with a thickness less than 1 µm, then in forming a single-crystal layer of single-crystal SiC by epitaxy on the transferred layer, allows the technical limits of the implantation tools that are industrially available to carry out the SMART CUT® process to be circumvented. Moreover, this process does not require a donor substrate made of semi-insulating SiC (which would be particularly expensive); specifically, since the transferred layer essentially plays the role of a seed layer for forming the heat-dissipating layer made of semi-insulating SiC, the transferred layer may be formed from single-crystal SiC of standard electrical resistivity.

Figure 8:
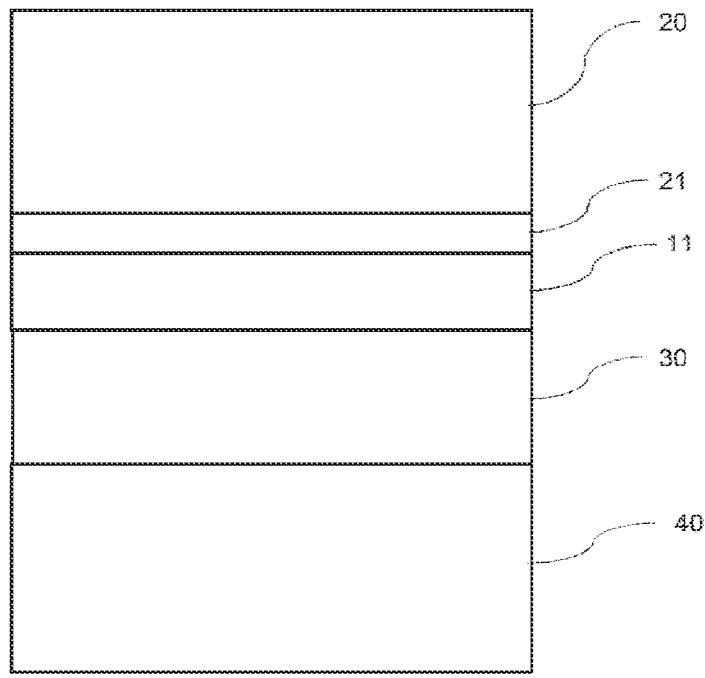
FIG. 8 is a schematic cross-sectional view of the structure of FIG. 7 being joined to a receiver substrate via the epitaxial layer of semi-insulating SiC.

With reference to FIG. 8, a second receiver substrate 40, which has a high electrical resistivity, is provided, and bonded to the layer 30 of semi-insulating SiC. For example, the second receiver substrate may be a silicon substrate having an electrical resistivity greater than or equal to 100 Sam, a polycrystalline SiC substrate or a polycrystalline AlN substrate, also having an electrical resistivity greater than or equal to 100 Ωcm.

The thickness of the layer 30 of semi-insulating SiC will possibly be chosen depending on the material of the second receiver substrate. Thus, when the second receiver substrate is a silicon substrate of high electrical resistivity, the layer 30 of semi-insulating SiC will advantageously have a thickness between 1 and 5 µm. When the second receiver substrate is made of polycrystalline AlN or polycrystalline SiC, it will possibly be advantageous for the layer 30 of semi-insulating SiC to have a much greater thickness, possibly of up to 80 µm, for example, of about 50 to 80 µm, to improve the dissipation of heat within the final structure.

Next, at least some of the bonding layer 21 is removed so as to detach the first receiver substrate from the rest of the structure. During this removal, the bonding layer 21 must be sufficiently damaged to allow a dissociation from the structure. Any suitable means may be employed. As a non-limiting example, the bonding layer may be removed via a chemical etch, a delamination by laser and/or the application of a mechanical stress.

Figure 9:
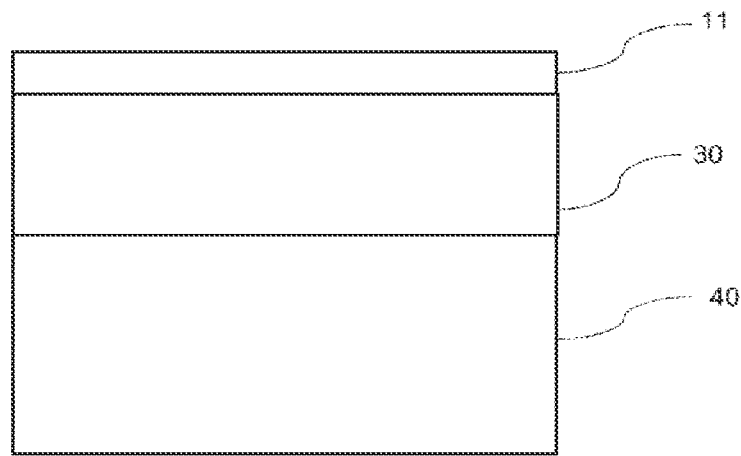
FIG. 9 is a schematic cross-sectional view of the removal of the temporary carrier from the structure of FIG. 8.

As illustrated in FIG. 9, there therefore remains, at the end of this separation, a structure that comprises, in succession, the second receiver substrate 40, the layer 30 of semi-insulating SiC and the transferred thin layer 11 of single-crystal SiC. Any residues of the bonding layer 21 are removed by polishing and/or etching.

Figure 10:
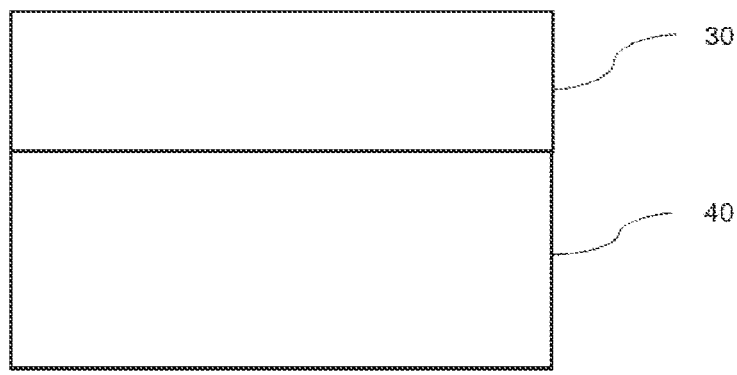
FIG. 10 is a schematic cross-sectional view of the receiver substrate and of the epitaxial layer of semi-insulating SiC after the thin layer of single-crystal SiC has been removed.

With reference to FIG. 10, the thin layer 11 is removed so as to uncover the layer 30 of semi-insulating SiC. The thin layer 11 may be removed by any suitable process, such as a chemical or mechanical etch.

The uncovered face is the silicon face of the semi-insulating SiC, which is favorable to the epitaxial growth of GaN. A substrate suitable for epitaxial growth of III-N alloys has thus been formed.

Figure 11:
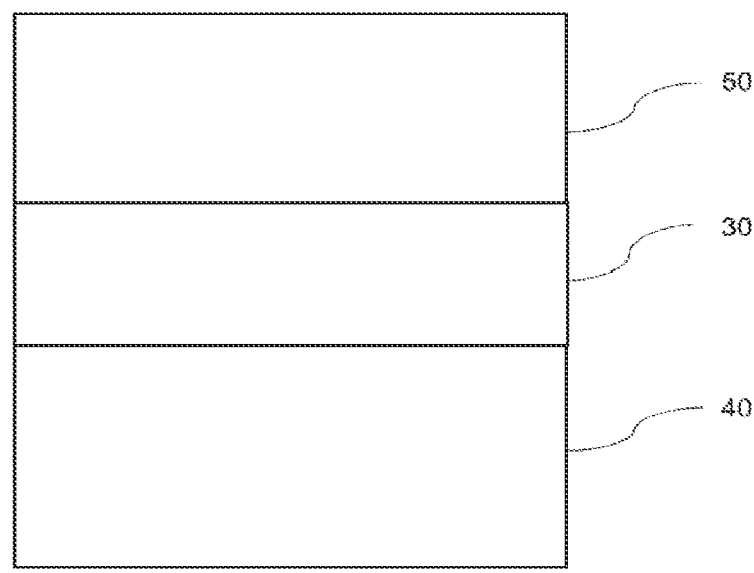
FIG. 11 is a schematic cross-sectional view of a layer of GaN being formed by epitaxy on the layer of semi-insulating SiC.

With reference to FIG. 11, a layer 50 of GaN (or, as mentioned above, of AlGaN or InGaN) is grown on the free face of the layer 30 of semi-insulating SiC. The thickness of the layer 50 is typically between 1 and 2 µm.

Figure 12:
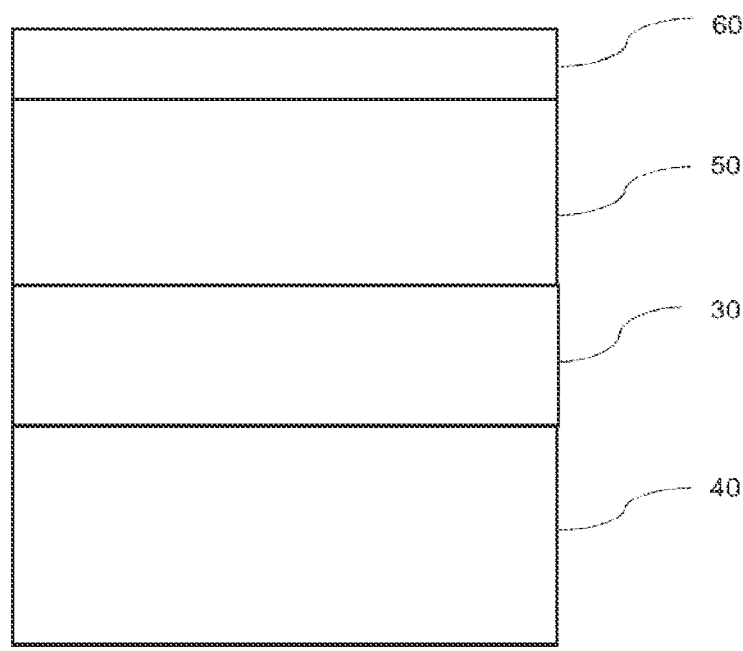
FIG. 12 is a schematic cross-sectional view of a heterojunction being formed by epitaxy of a layer of a III-N alloy different from GaN on the layer of GaN.

Next, as illustrated in FIG. 12, a heterojunction is formed by growing, by epitaxy, on the layer 50, a layer 60 of a III-N alloy different from that of the layer 50.

It is thus possible to continue the fabrication of transistors, in particular, of HEMTs, from this heterojunction, using processes known to those skilled in the art, the channel of the transistor being formed level with the heterojunction, and the source, the drain and the gate of the transistor being formed on the channel.

The structure thus obtained is particularly advantageous in that it comprises a relatively thick layer of semi-insulating SiC, which, on the one hand, serves as a seed layer for the epitaxial growth of the layer of III-N alloy and, on the other hand, both dissipates heat well and limits RF losses. Moreover, the second receiver substrate, which bears the layer of semi-insulating SiC, makes direct contact with the layer, so that the structure does not comprise any thermal barrier.

Thus, a HEMT or another high-frequency, high-power electronic device, formed in a layer of II-N alloy formed by epitaxy on such a structure, has minimized RF losses and a maximized dissipation of heat.

REFERENCES

[1] Comparative study on stress in AlGaN/GaN HEMT structures grown on 6H—SiC, Si and on composite substrates of the 6H—SiC/poly-SiC and Si/poly-SiC, M. Guziewicz et al., Journal of Physics: Conference Series 100 (2008) 040235.

The invention claimed is:
1. A method of fabricating a substrate for epitaxial growth of a layer of gallium nitride (GaN), of aluminum gallium nitride (AlGaN) or of indium gallium nitride (InGaN), comprising the following successive steps:

providing a single-crystal silicon-carbide donor substrate;

implanting ionic species into the donor substrate so as to form a weakened region that defines a thin layer of single-crystal SiC to be transferred;

bonding the donor substrate to a first receiver substrate via a bonding layer;

detaching the donor substrate along the weakened region so as to transfer the thin layer of SiC to the first receiver substrate;

performing epitaxial growth of a layer of semi-insulating SiC having a thickness greater than 1 µm on the thin layer of SiC;

bonding the layer of semi-insulating SiC to a second receiver substrate, the second receiver substrate having a high electrical resistivity;

removing at least one portion of the bonding layer so as to detach the first receiver substrate; and removing the transferred thin layer of single-crystal SiC, so as to uncover the layer of semi-insulating SiC.

2. The method of claim 1, wherein the first receiver substrate and the donor substrate have a difference in coefficient of thermal expansion less than or equal to $3\times10^{-6}$ $K^{-1}$.

3. The method of claim 1, wherein the first receiver substrate is an SiC substrate having a crystal quality lower than that of the donor substrate.

4. The method of claim 1, wherein the thin layer of single-crystal SiC transferred to the first receiver substrate has a thickness less than 1 µm.

5. The method of claim 1, wherein the bonding layer comprises a material that remains thermally stable during the epitaxial growth of the layer of semi-insulating SiC and that is able to be removed from the interface between the transferred layer of single-crystal SiC and the first receiver substrate.

6. The method of claim 1, wherein the bonding layer is a layer of silicon nitride or gallium nitride.

7. The method of claim 1, wherein removing at least one portion of the bonding layer comprises a chemical etch, a delamination by laser and/or application of a mechanical stress.

8. The method of claim 1, wherein the layer of semi-insulating SiC is formed by doping with vanadium during the epitaxial growth of the SiC.

9. The method of claim 1, wherein the layer of semi-insulating SiC is formed by simultaneously depositing silicon, carbon and vanadium.

10. The method of claim 1, wherein the second receiver substrate is a silicon substrate having an electrical resistivity greater than or equal to 100 Ω·cm.

11. The method of claim 10, wherein the epitaxial layer of semi-insulating SiC has a thickness between 1 and 5 µm.

12. The method of claim 1, wherein the second receiver substrate is a polycrystalline SiC substrate or a polycrystalline AlN substrate having an electrical resistivity greater than or equal to 100 Ω·cm.

13. The method of claim 12, wherein the epitaxial layer of semi-insulating SiC has a thickness less than or equal to 80 µm.

14. The method of claim 1, further comprising a step of recycling a segment of the donor substrate detached from the transferred layer.

15. The method of claim 1, wherein:
the ionic species are implanted through the silicon face of the donor substrate;
the silicon face of the donor substrate is bonded to the first receiver substrate; and
after the transferred thin layer of single-crystal SiC has been removed, the silicon face of the layer of semi-insulating SiC is uncovered.

16. A method of fabricating by epitaxy a layer of gallium nitride, comprising:
providing a substrate fabricated using the process according to claim 1; and
performing epitaxial growth of the layer of gallium nitride on the layer of semi-insulating SiC of the substrate.

17. The method of claim 16, wherein the layer of gallium nitride has a thickness between 1 and 2 µm.

18. A method of fabricating a high-electron-mobility transistor (HEMT), comprising:
fabricating by epitaxy a layer of gallium nitride, of aluminum gallium nitride or of indium gallium nitride using the process according to claim 16;
forming a heterojunction by epitaxy, on the layer, of a layer of a III-N material different from the material of the layer;
forming a channel of the transistor level with the heterojunction; and
forming a source, a drain and a gate of the transistor on the channel.

* * * * *

UNITED STATES PATENT AND TRADEMARK OFFICE
CERTIFICATE OF CORRECTION

PATENT NO. : 12,270,123 B2
APPLICATION NO. : 18/247859
DATED : April 8, 2025
INVENTOR(S) : Eric Guiot Page 1 of 1

It is certified that error appears in the above-identified patent and that said Letters Patent is hereby corrected as shown below:

In the Specification

| | | |
|---|---|---|
| Column 1, | Lines 61-62, | change "equal to 105 Sam, in order" to --equal to $10^5$ Ω·cm, in order-- |
| Column 2, | Line 65, | change "equal to 105 Ω·cm." to --equal to $10^5$ Ω·cm.-- |
| Column 6, | Line 55, | change "of 4H- or 6H—SiC is" to --of 4H- or 6H-SiC is-- |
| Column 7, | Lines 57-58, | change "to 100 Sam, a" to --to 100 Ω·cm, a-- |
| Column 7, | Line 60, | change "equal to 100 Ωcm." to --equal to 100 Ω·cm.-- |
| Column 8, | Line 58, | change "on 6H—SiC, Si" to --on 6H-SiC, Si-- |
| Column 8, | Line 59, | change "of the 6H—SiC/poly-SiC" to --of the 6H-SiC/poly-SiC-- |

Signed and Sealed this
Third Day of June, 2025

Coke Morgan Stewart
*Acting Director of the United States Patent and Trademark Office*